(12) United States Patent
Jiang et al.

(10) Patent No.: US 6,455,923 B1
(45) Date of Patent: *Sep. 24, 2002

(54) APPARATUS AND METHODS FOR PROVIDING SUBSTRATE STRUCTURES HAVING METALLIC LAYERS FOR MICROELECTRONICS DEVICES

(75) Inventors: Tongbi Jiang, Boise, ID (US); Walter L. Moden, Meridian, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,765

(22) Filed: Aug. 30, 1999

(51) Int. Cl.[7] ............................................. H01L 23/495
(52) U.S. Cl. ..................... 257/676; 257/675; 257/691; 257/668; 257/784; 257/669; 257/674
(58) Field of Search ............................... 257/676, 675, 257/668, 691, 712, 717, 784, 796, 669, 674

(56) References Cited

U.S. PATENT DOCUMENTS

| | | | | |
|---|---|---|---|---|
| 5,586,007 A | * | 12/1996 | Funada | 361/720 |
| 5,821,614 A | * | 10/1998 | Hashimoto et al. | 257/679 |
| 5,866,949 A | * | 2/1999 | Schueller | 257/778 |
| 6,025,640 A | * | 2/2000 | Yagi et al. | 257/666 |
| 6,066,515 A | * | 5/2000 | Schoenfeld | 438/123 |

FOREIGN PATENT DOCUMENTS

JP 411045959 A * 2/1999

* cited by examiner

*Primary Examiner*—David L. Talbott
*Assistant Examiner*—Luan Thai
(74) *Attorney, Agent, or Firm*—Dorsey & Whitney LLP

(57) ABSTRACT

The present invention is directed toward apparatus and methods for providing substrate structures having metallic layers for microelectronics devices. In one embodiment of the invention, an apparatus includes a substrate layer, and a metallic layer attached to the substrate layer, the metallic layer being attachable to a bottom surface of the microelectronics device. The metallic layer may advantageously provide a surface free from voids or irregularities for improved attachment of microelectronics devices. The metallic layer may also provide improved conduction of thermal energy away from the device, shielding from electromagnetic interference, a vapor barrier between the device and the substrate, and may serve as a convenient ground channel. In one embodiment, the metallic layer may be continuous layer. Alternately, the metallic layer may be segmented into a plurality of closely-fitted pieces, or a plurality of spaced-apart pieces separated by expansion joints. In another embodiment, an apparatus may include a second metallic layer formed on the substrate layer opposite from the first metallic layer. In a further embodiment, a plating layer is formed on the second metallic layer. In yet another embodiment, a microelectronics package includes a substrate layer, a metallic layer attached to the substrate layer, an attachment layer formed on at least part of the metallic layer, and a die having a bottom surface attached to the attachment layer. The attachment layer may be an adhesive layer, or alternately, a eutectic layer.

39 Claims, 4 Drawing Sheets

APPARATUS AND METHODS FOR PROVIDING SUBSTRATE STRUCTURES HAVING METALLIC LAYERS FOR MICROELECTRONICS DEVICES

TECHNICAL FIELD

The present invention relates to apparatus and methods for providing substrate structures having metallic layers for microelectronics devices such as, for example, chip-on-board packages, board-on-chip packages, dynamic random access memory packages, micro-ball grid array packages, and the like.

BACKGROUND OF THE INVENTION

As the trend toward decreasing the size and increasing the density of microelectronics packages continues, surface mounted chip-on-board (COB) packages. ball grid array (BGA) packages, and chip-scale-packages (CSP's) are commonly used to increase packaging density and reduce lead lengths for improving die performance. In such microelectronics packages, proper attachment of the die is a fundamental requirement.

FIG. 1 is a side cross-sectional view of a COB package 10 in accordance with the prior art. In this COB package, a die 12 has a bottom surface 14 attached to an electrically-insulative substrate layer 16, such as a printed circuit board, by an attachment layer 26. Typically, the electrically-insulative substrate layer 16 is composed of bismaleimide triazine (BT), a polymer designed for printed circuit boards and the like, although other materials may be successfully used, including epoxy-based materials such as FR4 and FR5. The substrate layer 16 may have an internal network or mesh of interwoven fibers (not shown) to improve the strength and rigidity of the substrate layer 16.

The COB package 10 has a plurality of bond pads 18 formed on the die 12 and a plurality of contact pads 20 formed on the substrate layer 16. A lead wire 22 electrically couples each bond pad 18 to one of the contact pads 20 in the conventional manner. An encapsulating material 24 (or glob top) is formed over the die 12, the bond pads 18, the contact pads 20, and the lead wires 22 to hermetically seal and protect these sensitive components from mechanical stress, humidity, oxidation, and other harmful elements.

Successful die attachment involves proper and consistent alignment of the die to a packaging substrate for improved automatic bonding yield. The die attachment should desirably be uniform and void-free over the contact area between the bottom surface 14 and the attachment surface 28 to provide good mechanical strength and thermal conduction. The die attachment should also be free of flakes or other debris which may later come loose and cause a malfunction of the microelectronics package.

Typically, the die 12 may be attached to the substrate layer 16 by applying an adhesive material, such as an epoxy adhesive, onto a die attachment surface 28. The die 12 is then positioned over the epoxy adhesive and pressed against the epoxy adhesive to form a thin, uniform adhesive layer 26 between the bottom surface 14 of the die 12 and the die attachment surface. The adhesive layer 26 may then be cured, such as by heating the COB package 10 in an oven. to bond the die 12 to the substrate layer 16

Alternately, the die 12 may be eutectically bonded to the substrate layer 16. Eutectic bonding takes place when two materials melt together (alloy) at a lower temperature than either of them separately. The two eutectic materials most commonly used for die attachment are gold and silicon. Although the melting point of gold is 1063° C. and the melting point of silicon is 1415° C., when the two materials are mixed together, they alloy at about 380° C. Methods of eutectic die attachment are described, for example, in U.S. Pat. No. 5,037,778 issued to Stark and Whitcomb, and in U.S. Pat. No. 5,760,473 issued to Dickson and Max, which patents are incorporated herein by reference.

For eutectic die attachment, a layer of gold may be plated onto the die attachment surface 28. The COB package 10 may then be heated so that the gold layer alloys with the silicon bottom surface 14 of the die 12 to form the attachment layer 26. Alternately, a layer of alloy material composed of gold and silicon may be place on the attachment surface 28, and the COB package 10 heated so the gold and silicon layer alloys and bonds with the silicon bottom surface 14 and silicon attachment surface 28. With the die 12 located in the desired position, the die is compressed against the liquid gold-silicon alloy and moved in a "scrubbing" action to form the eutectic attachment layer 26. The COB package 10 is then cooled to complete the eutectic bond, thereby attaching the die 12 to the substrate layer 16.

Die attachment using an epoxy adhesive layer is favored over eutectic bonding for its economy and ease of processing. Epoxy adhesives, however, do not provide the strength of eutectic bonding, and may decompose at high temperatures, such as those experienced during bonding of the bond pads 18 and contact pads 20 and sealing of the COB package 10. Also, the attachment surface 28 of the substrate layer 16 may contain voids or surface irregularities that degrade die attachment, particularly those substrate layers having an interwoven mesh of fibers.

SUMMARY OF THE INVENTION

The present invention relates to apparatus and methods for providing substrate structures having metallic layers for microelectronics devices. In one aspect of the invention, an apparatus includes an electrically-insulative substrate layer, and a metallic layer attached to the electrically-insulative substrate layer, the metallic layer being attachable to a bottom surface of the microelectronics device. The metallic layer may advantageously provide a surface free from voids or irregularities for improved attachment of microelectronics devices. The metallic layer may also provide improved conduction of thermal energy away from the device, shielding from electromagnetic interference, a moisture barrier between the device and the substrate, and may serve as a convenient ground channel. In one aspect, the metallic layer may be continuous layer. Alternately, the metallic layer may be segmented into a plurality of closely-fitted pieces, or a plurality of spaced-apart pieces separated by expansion joints.

In another aspect, an apparatus may include a second metallic layer formed on the electrically-insulative substrate layer opposite from the first metallic layer. The second metallic layer may improve rigidity of the substrate layer and may provide additional shielding for the die from electromagnetic interference. Alternately, a solder resist layer may be formed on the first metallic layer to protect and mask the first metallic layer during processing. In a further aspect, a plating layer is formed on the second metallic layer.

In yet another aspect, a microelectronics package includes an electrically-insulative substrate layer, a metallic layer attached to the electrically-insulative substrate surface, an attachment layer formed on at least part of the metallic layer, and a die having a bottom surface attached to the attachment layer. The attachment layer may be an adhesive layer, or alternately, a eutectic layer. In another aspect, a microelectronics package may include a second metallic layer attached to the electrically-insulative substrate layer substantially opposite from the first metallic layer. In still another aspect, a plating layer may be disposed on the second metallic layer.

DETAILED DESCRIPTION OF THE INVENTION

The following description is generally directed toward apparatus and method for providing substrate structures having metallic layers for microelectronics devices. Many specific details of certain embodiments of the invention are set forth in the following description and in FIGS. 2–9 to provide a thorough understanding of such embodiments. One skilled in the art, however, will understand that the present invention may have additional embodiments, or that the present invention may be practiced without several of the details described in the following description.

Figure 1:
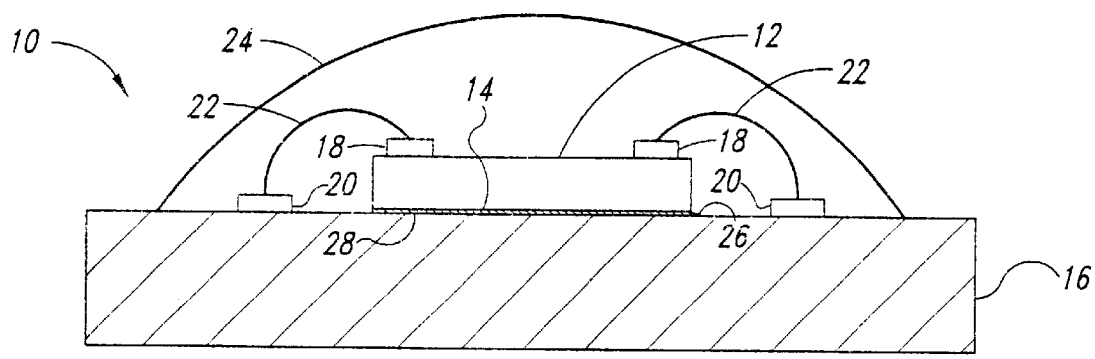
FIG. 1 is a side cross-sectional view of a chip-on-board package in accordance with the prior art.
Figure 2:
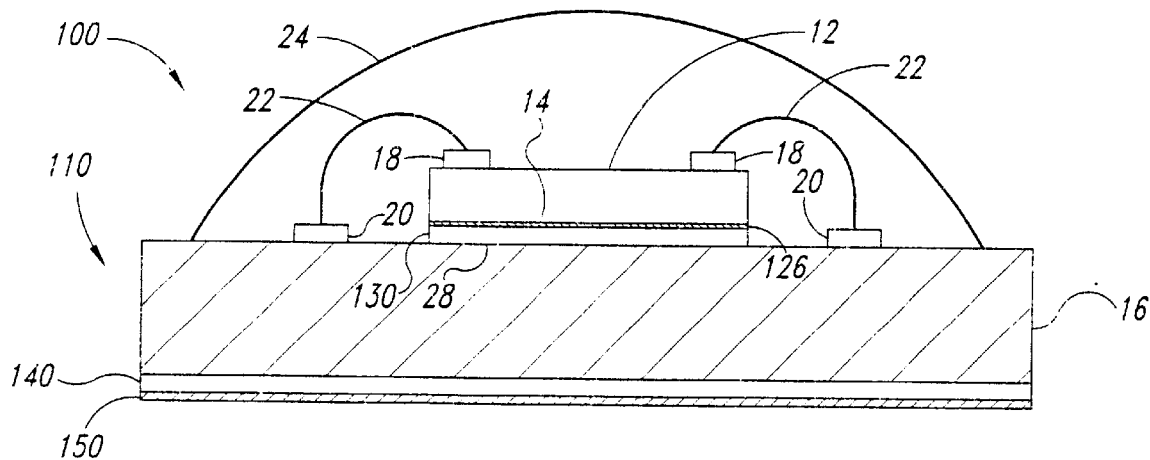
FIG. 2 is a side cross-sectional view of a chip-on-board package in accordance with an embodiment of the invention.

FIG. 2 is a side cross-sectional view of a chip-on-board package 100 in accordance with an embodiment of the invention. In this embodiment, the COB package 100 includes a die 12 having a bottom surface 14 attached to a substrate support structure 110 by an attachment layer 126. The substrate support structure 110 includes a metallic layer 130 formed on a die attachment surface 28 of an electrically-insulative substrate layer 16. The bottom surface 14 of the die 12 is attached to the metallic layer 130.

The COB package 100 also includes a plurality of bond pads 18 formed on the die 12 and a plurality of contact pads 20 formed on the substrate layer 16. A lead wire 22 electrically couples each bond pad 18 to one of the contact pads 20, and an encapsulating material 24 is formed over the die 12, the metallic layer 130, the bond pads 18, the contact pads 20, and the lead wires 22.

Figure 3:
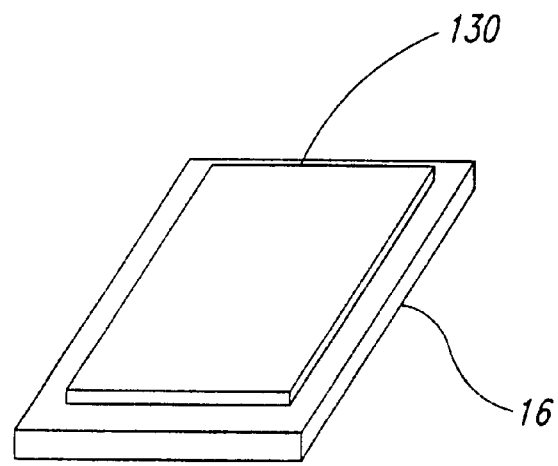
FIG. 3 is an isometric view of the metallic layer and the substrate layer of the chip-on-board package of FIG. 2.

FIG. 3 is an partial isometric view of the metallic layer 130 and the substrate layer 16 of the chip-on-board package 100 of FIG. 2. In this embodiment, the metallic layer 130 is a continuous rectangular layer. Although the size of the metallic layer 130 may vary, the metallic layer 130 is preferably sized to be at least about 95% of the size of the bottom surface 14 of the die 12.

The COB package 100 having the metallic layer 130 advantageously improves the attachment of the die 12 to the substrate layer 16. The metallic layer 130 provides a relatively rigid, void-free die attachment surface. It provides improved mechanical attachment and improved thermal conduction compared with the prior art method of attaching the die 12 directly to the substrate layer 12.

Figure 4:
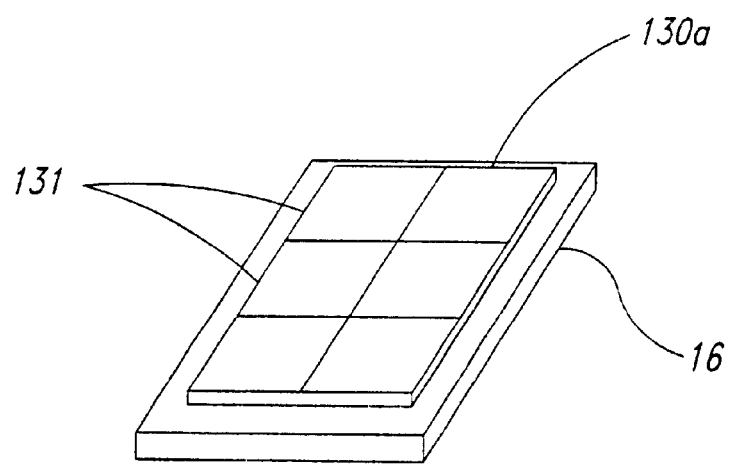
FIG. 4 is an isometric view of an alternate embodiment of a metallic layer and substrate layer of the chip-on-board package of FIG. 2.

FIG. 4 is an isometric view of an alternate embodiment of a metallic layer 130A and the substrate layer 16 of the chip-on-board package 100 of FIG. 2. In this embodiment the metallic layer 130 is a segmented layer composed of a plurality of substantially flat pieces of metal 131. The flat metal pieces 131 which comprise the metallic layer 130 may be closely spaced and tightly fitted, or may be spaced apart to form joints. The joints may be designed to serve as expansion joints to reduce stresses which would otherwise develop in the COB package 10 due to differential expansion of the components of the package during thermal cycling.

The metallic layer 130 (or 130A) advantageously serves as a moisture barrier between the die 12 and the substrate layer 16, as well as a barrier against other bi-products that may be out-gassed from the substrate layer 16 during processing or during operation of the COB package 100. The metallic layer 130 also serves as a heat sink and provides improved conduction of thermal energy away from the die 12, particularly for high power applications. Thus, the metallic layer 130 may serve to improve the operating conditions of the die 12, thereby improving the performance and useful life of the die 12.

Yet another advantage is that the metallic layer 130 provides an electrically conductive layer which may conveniently serve as a ground channel for the die 12. The die 12 may be electrically coupled to the metallic layer 130 in any suitable fashion, including, for example, by attaching the die 12 to the metallic layer 130 using an electrically conductive adhesive layer 126, or by attachment of a lead wire 22 from the die 12 to the metallic layer 130. In some applications, such as, for example, the Rambus® BGA package (shown and described at www.rambus.com and incorporated herein by reference), a convenient ground channel such as the metallic layer 130 may be critical to the successful design of the package.

Another advantage of the metallic layer 130 is that it may serve to shield the die 12 from electromagnetic interference from neighboring electromagnetic sources, such as power sources, other die, or other electronics components. The metallic layer 130 may therefore enhance die performance by reducing spurious electromagnetic signals which may cause the die 12 to malfunction One may note that the attachment layer 126 which bonds the bottom surface 14 of the die 12 to the metallic layer 130 may be an adhesive layer or a suitable eutectic alloy, depending upon the material used for the metallic layer 130. Although any number of materials may be used for the metallic layer 130, copper (Cu) economically provides the desirable characteristics described above, and bonds well to materials commonly used for the electrically-insulative substrate 12. Other materials suitable for use as the metallic layer 130 include, but are not limited to, gold (Au) and nickel (Ni).

As shown in FIG. 2, the substrate support structure 110 of the COB package 100 may also include a second metallic layer 140 formed on a lower surface of the substrate layer 12 opposite from the attachment surface 28. The second metallic layer 140 may further stiffen the substrate layer 16 to prevent bending or warping of the layer, and may further improve the attachment of the die 12 to the first metallic layer 130. The second metallic layer 140 may also provide additional shielding of the die 12 from electromagnetic signals which may damage or interfere with the performance of the die 12.

Although the second metallic layer 140 shown in FIG. 2 is more extensive than the first metallic layer 130, the sizes of the first and second metallic layers 130, 140 may be adjusted as desired so that the second metallic layer 140 may be smaller than, or coextensive with, the first metallic layer 130. Also, the second metallic layer 130 may be a continuous layer as shown in FIG. 2, or may be segmented into a plurality of pieces which may be closely spaced and tightly fitted, or separated by expansion joints. Furthermore, the first and second metallic layers 130, 140 may be composed of the same materials or of different materials depending upon the desired characteristics or operating environment of the microelectronics package.

As further shown in FIG. 2, the substrate support structure 110 may also include a plating layer 150 formed on the second metallic layer 140. The plating layer 150 may be composed of any number of materials (e.g. gold, nickel), and may be desirable for a variety of applications, including, for example, to provide a metallic plating layer 150 amenable to eutectic bonding of the COB package 100 to a support material (e.g. silicon) in the manner described above. The plating layer 150 may also provide further shielding to the die 12 from spurious electromagnetic interference, and may further enhance the strength and stiffness of the substrate support structure.

Figure 5:
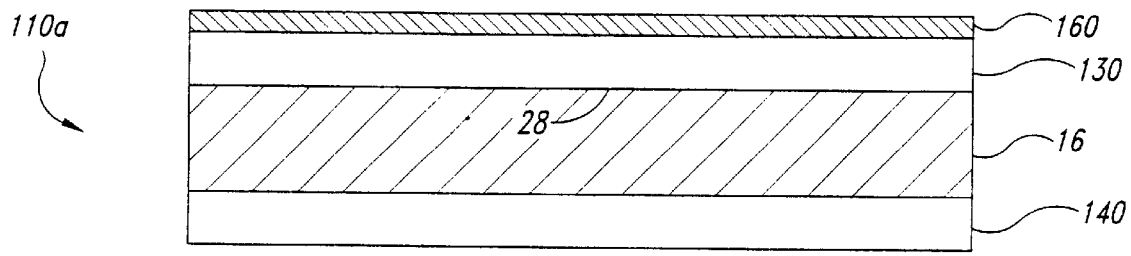
FIG. 5 is a side cross-sectional view of a substrate support structure in accordance with an embodiment of the invention.

One embodiment of a method of forming the substrate support structure 110 shown in FIG. 2 will now be described with reference to FIGS. 5–7. FIG. 5 is a side cross-sectional view of a substrate support structure 110A having the first metallic layer 130 formed on the die attachment surface 28 of the electrically-insulative substrate layer 16. The first metallic layer 130 may be formed in a variety of ways, including, for example, by vapor deposition or sputtering techniques, or by attachment of a metallic sheet to the substrate layer 16 using a suitable adhesive. As described above, the first metallic layer 130 may be continuous, or may be formed of a plurality of closely spaced or segmented metallic pieces. Similarly, the second metallic layer 140 is formed on the lower surface of the electrically nonconductive substrate layer 16.

A solder resist layer 160 may then be formed on the first metallic layer 130 using known techniques to mask off and insulate those areas of the first metallic layer 130 where soldering is not desired or required. Typically, the solder resist layer 160 will mask at least an area coextensive with the bottom surface 14 of the die 12 (FIG. 2). With the solder resist layer 160 in place, the substrate support structure 110A may be processed without contaminating the die attachment area of the first metallic layer 130.

Figure 6:
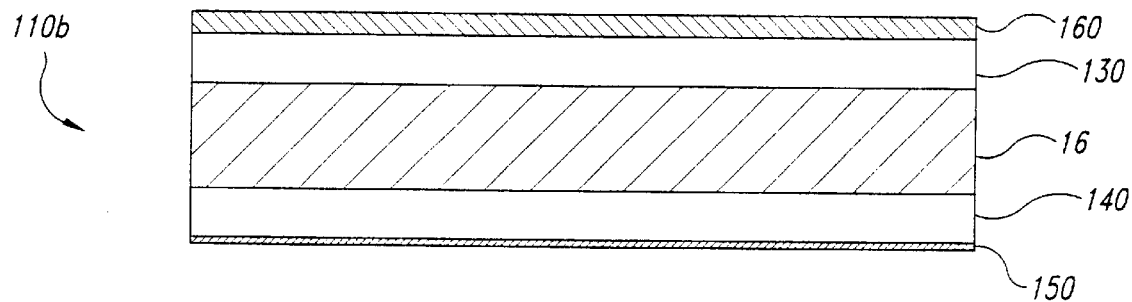
FIG. 6 is a side cross-sectional view of a substrate support structure in accordance with an embodiment of the invention.

As shown in FIG. 6, the plating layer 150 may then be formed on the second metallic layer 140. The plating layer 150 may be formed using a variety of conventional techniques, including vapor deposition or sputtering. In this embodiment, the plating layer 150 and second metallic layer 140 are coextensive with the first metallic layer 130, however, as described above, the relative sizes of the first and second metallic layers 130, 140 and the plating layer 150 may be varied as desired.

Figure 7:
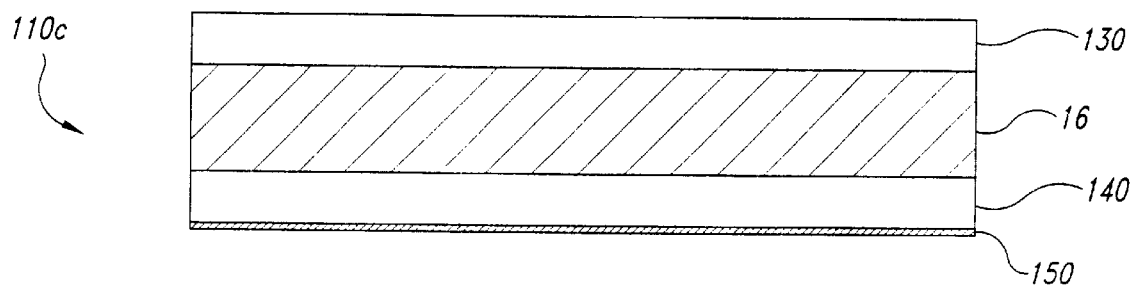
FIG. 7 is a side cross-sectional view of a substrate support structure in accordance with an embodiment of the invention.
Figure 8:
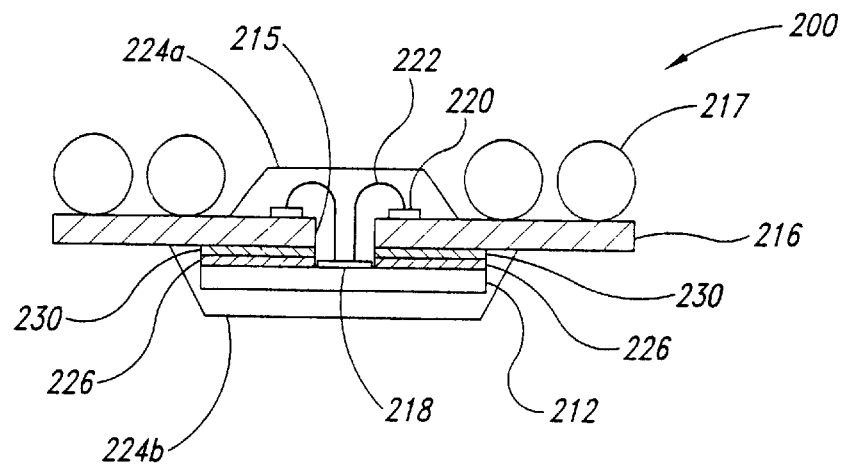
FIG. 8 is a side cross-sectional view of a board-on-chip package in accordance with an alternate embodiment of the invention.
Figure 9:
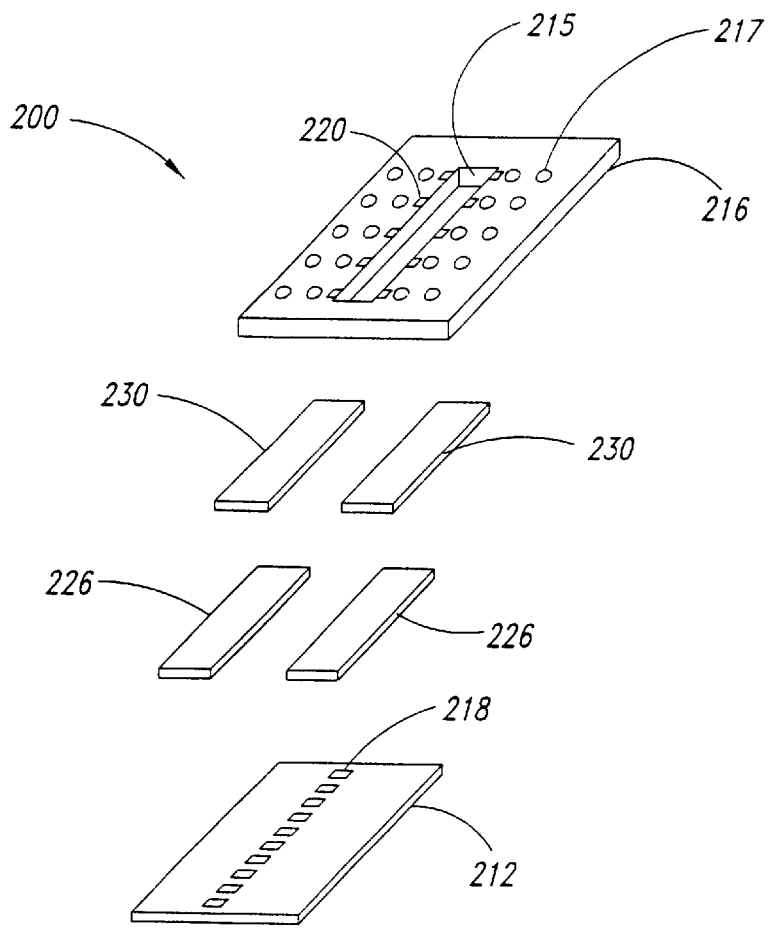
FIG. 9 is a partial exploded isometric view of the board-on-chip package of FIG. 8.

After the plating layer 150 is formed and any other processing of the substrate support structure 110B (e.g. etching) has been accomplished, the solder resist layer 160 may be removed from the first metallic layer 130 as shown in FIG. 7. The solder resist layer 160 may be removed using conventional techniques for removal of resist layers from metallized surfaces, including, for example, plasma $O_2$ stripping or wet chemical processing using organic strippers, chromic sulfuric acid mixtures, solvent strippers, solvent-amine strippers, or specialty strippers. After the solder resist layer 160 is removed, the substrate support structure 110C is suitable for attachment of the die 12 or additional processing FIG. 8 is a side cross-sectional view of a board-on-chip (BOC) package 200 in accordance with an alternate embodiment of the invention. FIG. 9 is a partial exploded isometric view of the BOC package 200 of FIG. 8. In this embodiment, the BOC package 200 includes a die 212 having a plurality of bond pads 218 formed thereon, and a substrate layer 216 having an aperture 215 formed therethrough, and a plurality of solder balls 217 formed thereon. A plurality of contact pads 220 are formed on the substrate layer 216 and are electrically coupled with the bond pads 218 by a plurality of lead wires 222 that extend through the aperture 215. A pair of metallic segments 230 are formed on the substrate layer 216 adjacent the aperture 215. A pair of attachment layers 226 attach the die 212 to the metallic segments 230. In alternate embodiments, the metallic segments 230 may each be composed of a plurality of metallic pieces 131 that may be closely fitted or spaced apart by expansion joints as described above and as shown in FIG. 4. A first encapsulating section 224A is formed over the lead wires 222 and contact pads 220, and a second encapsulating section 224B is formed over the die 212.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part with prior art apparatus and methods to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods for providing substrate structures having metallic layers for microelectronics devices, and not just to the apparatus and methods described above and shown in the figures. In general, in the following claims, the terms used should not be construed to limit the invention to the specific embodiments disclosed in the specification and the claims, but should be construed to include all apparatus and for providing substrate structures having metallic layers for microelectronics devices that operate within the broad scope of the claims. Accordingly, the invention is not limited by the foregoing disclosure, but instead its scope is to be determined by the following claims.

What is claimed is:

1. A support structure for a microelectronics device, comprising:

a substrate layer; and a metallic layer attached to the substrate layer, the metallic layer being attachable directly to the microelectronics device by an adhesive layer and being substantially coextensive with the microelectronics device, the metallic layer comprising a, plurality of metallic pieces spaced apart to form first and second expansion joints, the first and second expansion joints being orthogonally oriented with respect to each other, the metallic pieces adjacent the expansion joint being expandable into the expansion joint when the metallic layer is heated.

2. The support structure of claim 1 wherein the substrate has an aperture disposed therethrough and including a first surface having a plurality of contact pads formed thereon, and a second surface substantially opposite from the first surface, and wherein the metallic layer is attached to the second surface proximate the aperture, the contact pads being electrically coupleable to a plurality of bond pads on the microelectronic device when the microelectronic device is attached to the metallic layer by a plurality of lead wires extending through the aperture.

3. The support structure of claim 1 wherein the metallic layer comprises a gold layer.

4. The support structure of claim 1 wherein a portion of the plurality of metallic pieces in the metallic layer are closely-fitted.

5. The support structure of claim 1 wherein the substrate layer comprises an electrically insulative material.

6. The support structure of claim 1 wherein the substrate layer includes an interwoven mesh of fibers.

7. The support structure of claim 1 wherein the substrate layer includes a plurality of contact pads formed thereon, the contact pads being electrically coupleable to the microelectronics device.

8. The support structure of claim 1 wherein the metallic layer comprises a first metallic layer disposed on a first surface of the substrate layer and a second metallic layer disposed on an opposing surface of the substrate layer.

9. The support structure of claim 8 wherein the second metallic layer is substantially coextensive with the first metallic layer.

10. The support structure of claim 8 wherein the second metallic layer comprises a copper layer.

11. The support structure of claim 8, further comprising a plating layer disposed on the second metallic layer.

12. The support structure of claim 11 wherein the plating layer comprises a gold layer.

13. The support structure of claim 11 wherein the plating layer comprises a nickel layer.

14. The support structure of claim 1 wherein the substrate layer comprises a bismaleimide triazine layer.

15. The support structure of claim 1 wherein the expansion joint is formed along a first axis.

16. The support structure of claim 1 wherein the expansion joint is formed along a plurality of axes.

17. The support structure of claim 1 wherein the expansion joint is formed along a first axis and a second axis, the second axis being substantially orthogonal to the first axis.

18. A microelectronics package, comprising:

a substrate layer;

a metallic layer attached to the substrate layer, the metallic layer comprising a plurality of metallic pieces spaced apart to form first and second expansion joints, the first and second expansion joints being orthogonally oriented with respect to each other, the metallic pieces adjacent the expansion joint being expandable into the expansion joint when the metallic layer is heated;

an attachment layer formed on at least part of the metallic layer; and a die having a bottom surface attached to the attachment layer, the metallic layer being sized to be substantially co-extensive with the die.

19. The microelectronics package of claim 18 wherein the metallic layer comprises a copper layer.

20. The microelectronics package of claim 18 wherein a portion of the plurality of metallic pieces in the metallic layer are closely-fitted.

21. The microelectronics package of claim 18 wherein the attachment layer comprises an adhesive layer.

22. The microelectronics package of claim 18 wherein the attachment layer comprises a eutectic layer.

23. The microelectronics package of claim 18 wherein the substrate has an aperture disposed therethrough and including a first surface having a plurality of contact pads formed thereon, and a second surface substantially opposite from the first surface, and wherein the metallic layer is attached to the second surface proximate the aperture, and wherein the die is attached tie metallic layer and includes a plurality of bond pads formed thereon, the contact pads being electrically coupled to the bond pads by a plurality of lead wires, each lead wire having a first end electrically coupled to one of the bond pads and extending through the aperture to a second end electrically coupled to one of the contact pads.

24. The microelectronics package of claim 18 wherein the metallic layer comprises a first metallic layer disposed on a first surface of the substrate layer and a second metallic layer disposed on an opposing surface of the substrate layer.

25. The microelectronics package of claim 24 wherein the second metallic layer is substantially coextensive with the first metallic layer.

26. The microelectronics package of claim 24, further comprising a plating layer disposed on the second metallic layer.

27. The microelectronics package of claim 18 wherein the metallic layer comprises a metallic attachment area that is at least 95% of a bottom surface area of the die.

28. The microelectronics package of claim 18 wherein the expansion joint is formed along a first axis.

29. The microelectronics package of claim 18 wherein the expansion joint is formed along a plurality of axes.

30. The microelectronics package of claim 18 wherein the expansion joint is formed along a first axis and a second axis, the second axis being substantially orthogonal to the first axis.

31. A microelectronics package, comprising:

a substrate layer having an aperture disposed therethrough and including a first surface having a plurality of contact pads formed thereon, and a second surface substantially opposite from the first surface;

a pair of metallic regions formed on the second surface on substantially opposing sides of the aperture and not extending into the aperture, each metallic region comprising a plurality of metallic pieces spaced apart to form first and second expansion joints within each metallic region, the first and second expansion joints being orthogonally oriented with respect to each other, the metallic pieces adjacent each expansion joint being expandable into the expansion joint when the metallic region is heated;

a pair of attachment layers, each attachment layer being formed on one of the metallic regions, a die including a facing surface having a plurality of bond pads formed thereon, the facing surface being attached to the pair of attachment layers, the pair of metallic regions not extending beyond a perimeter of the die; and a plurality of lead wires each having a first end electrically coupled to one of the bond pads and extending through the aperture to a second end electrically coupled to one of the contact pads.

32. The microelectronics package of claim 31 wherein at least one of the metallic regions comprise a copper region.

33. The microelectronics package of claim 31 wherein a portion of the plurality of metallic pieces in at least one metallic region are closely-fitted.

34. The microelectronics package of claim 31 wherein at least one of the attachment layers comprises an adhesive layer.

35. The microelectronics package of claim 31 wherein at least one of the attachment layers comprises a eutectic layer.

36. The microelectronics package of claim 31 wherein the pair of metallic regions comprise a metallic attachment area that is at least 95% of the facing surface of the die.

37. The microelectronics package of claim 31 wherein the expansion joint is formed along a first axis.

38. The microelectronics package of claim 31 wherein the expansion joint is formed along a plurality of axes.

39. The microelectronics package of claim 31 wherein the expansion joint is formed along a first axis and a second axis, the second axis being substantially orthogonal to the first axis.

* * * * *